United States Patent
Yuan

(10) Patent No.: US 9,812,541 B2
(45) Date of Patent: Nov. 7, 2017

(54) ARRAY SUBSTRATE, METHOD FOR FABRICATING THE SAME AND DISPLAY DEVICE

(71) Applicant: BOE TECHNOLOGY GROUP CO., LTD., Beijing (CN)

(72) Inventor: Guangcai Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/422,321

(22) PCT Filed: Mar. 25, 2014

(86) PCT No.: PCT/CN2014/074032
§ 371 (c)(1),
(2) Date: Feb. 18, 2015

(87) PCT Pub. No.: WO2015/100859
PCT Pub. Date: Jul. 9, 2015

(65) Prior Publication Data
US 2016/0027886 A1  Jan. 28, 2016

(30) Foreign Application Priority Data
Jan. 3, 2014   (CN) .......................... 2014 1 0003682

(51) Int. Cl.
*H01L 29/78*  (2006.01)
*H01L 29/423*  (2006.01)
(Continued)

(52) U.S. Cl.
CPC .... *H01L 29/42384* (2013.01); *H01L 27/1225* (2013.01); *H01L 27/1285* (2013.01);
(Continued)

(58) Field of Classification Search
CPC ............... H01L 29/42384; H01L 29/24; H01L 27/1225
See application file for complete search history.

(56) References Cited

U.S. PATENT DOCUMENTS

2007/0097304 A1  5/2007 Lim
2012/0280239 A1  11/2012 Liu et al.
(Continued)

FOREIGN PATENT DOCUMENTS

CN  101656232 A  2/2010
CN  102651341 A  8/2012
(Continued)

OTHER PUBLICATIONS

Chinese Office Action dated Oct. 9, 2015 in CN 201410003682.1.
(Continued)

*Primary Examiner* — Trang Tran
(74) *Attorney, Agent, or Firm* — Collard & Roe, P.C.

(57) ABSTRACT

A method for fabricating an array substrate is disclosed, the array substrate includes a first TFT and a pixel electrode. The method includes: forming a buffer layer (322) on the substrate (321); depositing an active layer film (323, 324) and a transparent electrode layer (326) on the substrate (321) having the buffer layer (322) formed thereon, and forming patterns of an active layer (171), a source/drain electrode (151, 152) and a pixel electrode of the first TFT through a single patterning process. An array substrate and a display device fabricated by the above method are also disclosed. By means of the fabrication method, it significantly reduces the fabrication cycle of the TFT, improves the stability of the TFT, such that threshold voltage of the TFT will not drift severely. Meanwhile, the product yield is improved and the lifetime of the device is extended.

17 Claims, 4 Drawing Sheets

(51) Int. Cl.
  *H01L 27/12* (2006.01)
  *H01L 29/24* (2006.01)
  *H01L 29/51* (2006.01)
  *H01L 29/786* (2006.01)

(52) U.S. Cl.
  CPC .......... *H01L 27/1288* (2013.01); *H01L 29/24* (2013.01); *H01L 29/513* (2013.01); *H01L 29/517* (2013.01); *H01L 29/518* (2013.01); *H01L 29/7869* (2013.01); *H01L 29/78606* (2013.01); *H01L 29/78696* (2013.01); *H01L 2029/42388* (2013.01)

(56) References Cited

U.S. PATENT DOCUMENTS

2012/0320299 A1   12/2012   Kim et al.
2013/0302939 A1   11/2013   Liu et al.
2014/0117371 A1*  5/2014   Ma ........................ H01L 27/124
                                                       257/72

FOREIGN PATENT DOCUMENTS

CN       102768989 A    11/2012
CN       103123910 A    5/2013
CN       103489827 A    1/2014
KR       101347163 B1   1/2014
TW       201205168 A    2/2012

OTHER PUBLICATIONS

Second Chinese Office Action in Chinese Application No. 201410003682.1, dated Apr. 5, 2016 with English translation.
English translation of the International Preliminary Report on Patentability and Written Opinion of the International Searching Authority of PCT/CN2014/074032, dated Jul. 5, 2016.
International Search Report and Written Opinion of the International Searching Authority with Notice of Transmittal of the International Search Report and Written Opinion of PCT/CN2014/074032 in Chinese, dated Oct. 13, 2014.

* cited by examiner

US 9,812,541 B2

ARRAY SUBSTRATE, METHOD FOR FABRICATING THE SAME AND DISPLAY DEVICE

CROSS REFERENCE TO RELATED APPLICATIONS

This application is the National Stage of PCT/CN2014/074032 filed on Mar. 25, 2014, which claims priority under 35 U.S.C. §119, of Chinese Application No. 201410003682.1, filed on Jan. 3, 2014, the disclosure of which is incorporated by reference.

FIELD OF THE ART

Embodiments of the invention relate to the technical field of displays, more particularly, to an array substrate, a method for fabricating the same and a display device.

BACKGROUND

Display technology experienced rapid development over the past several years. For example, in terms of Thin Film Transistor (TFT) technologies, amorphous Silicon (a-Si) TFTs are gradually replaced with Low Temperature Poly Silicon (LTPS) TFTs, Metal Induced Lateral Crystallization (MILC) TFTs and Oxide TFTs. As for light emitting technologies, the previously available Liquid Crystal Displays (LCDs), Plasma Display Panels (PDPs) are replaced with Organic Light Emitting Diodes (OLEDs), Active Matrix Organic Light Emitting Diodes (AMOLEDs) and the like. As a new generation of displays, organic light emitting displays have the advantages of self-luminous, fast response, wide viewing angle and applicable to flexible displays, transparent displays and 3D displays, in comparison with LCDs. However, whether the display device is a LCD or an organic light emitting display, a switch device, such as a TFT, is required to control each pixel in the display, such that each pixel can be control independently through a drive circuit while not causing crosstalk to other pixels.

Oxide TFTs that use an oxide semiconductor as the active layer have the advantages of high mobility, high ON-state current, better switch characteristics. Therefore, oxide TFTs are widely used in applications requiring fast response and large current, such as high frequency, high resolution, and large dimension displays and OLED displays.

However, conventional methods for fabricating oxide TFTs generally comprise six patterning processes respectively for forming a gate line and a gate electrode, a gate insulation layer, an active layer, an etch stop layer, a source/drain electrode, a passivation layer and via holes. Six exposure processes by using a mask will render the performance of the TFTs instable, the fabrication cycle long, and the fabrication cost high.

SUMMARY

Embodiment of the invention provide an array substrate that can effectively reduce cost, simplify process and improve stability of TFTs, a method for fabricating the same and a display device.

In one aspect of the invention, a method for fabricating an array substrate comprising a first TFT and a pixel electrode is provided. The method for fabricating such an array substrate comprises:

forming a buffer layer on a substrate; and depositing an active layer film, a source/drain metal film and a transparent electrode layer on the substrate having the buffer layer formed thereon, and forming patterns of an active layer, a source/drain electrode and a pixel electrode of the first TFT through a single patterning process.

In another aspect of the invention, an array substrate fabricated by the above fabrication method is provided. The array substrate comprises: a substrate; a buffer layer, an active layer, a source/drain electrode, a pixel electrode, a gate insulation layer, and a gate electrode layer disposed on the substrate, wherein the source/drain electrode is in direct contact with the pixel electrode.

In still another aspect of the invention, a display device comprising the above array substrate is provided.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
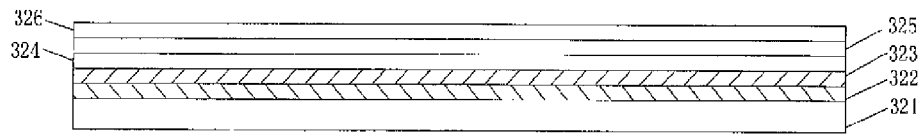
FIGS. 1 to 9 illustrate steps of a method for fabricating an array substrate, according to an embodiment of the invention, illustrated by taking cross sections along lines A-A and B-B in FIG. 10.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components.

An embodiment of the invention provides a method for fabricating an array substrate, and the array substrate comprises a TFT and a pixel electrode. The method comprises:

forming a buffer layer on a substrate; and depositing a semiconductor material, a source/drain metal material and a transparent electrode layer on the substrate having the buffer layer formed thereon, and forming patterns of an active layer, a source/drain electrode and a pixel electrode of the TFT through a single patterning process.

Forming the active layer, the source/drain electrode layer and the pixel electrode through a single patterning process may significantly reduce the fabrication cycle of the TFT. Meanwhile, as there are less process steps, the stability and reliability of the TFT may be effectively improved, such that threshold voltage of the TFT will not drift severely. At the same time, the product yield may be improved and the fabrication cost reduced, such that the lifetime of the device is longer. The array substrate fabricated according to the method is applicable to top gate LCD display devices.

Moreover, an embodiment of the invention further provides a method for fabricating an array substrate applicable to a top-gate OLED structure.

In the following, the invention will be described in detail in connection with drawings and embodiments of the invention.

Embodiment 1

In the embodiment, an OLED array substrate comprising two TFTs will be taken as an example to illustrate a method for fabricating such an array substrate. For example, the array substrate comprises a first TFT, a second TFT and a pixel electrode, wherein active layers and source/drain electrodes of the first and second TFTs are formed through a single patterning process. The patterning process as used herein comprises processes such as photoresist applying, exposing, etching and photoresist peeling, wherein the photoresist is positive photoresist.

The embodiment of the invention provides a method for fabricating a top gate array substrate. The method comprises:

Step 1: forming a buffer layer 322 on a substrate 321; the buffer layer 322 can effectively prevent adversary impact on the device caused by the direct contact between the glass substrate and the semiconductor layer.

Step 2: depositing an active layer film, a source/drain metal film and a transparent electrode layer on the substrate which has the buffer layer formed thereon, and forming patterns of an active layer, a source/drain electrode and a pixel electrode of the first TFT through a single patterning process.

As an example, the pattern of the active layer comprises a pattern of an intrinsic semiconductor layer and/or a pattern of a doped semiconductor layer. The figure illustrating the step is described with reference to an example of the active layer comprising both a pattern of an intrinsic semiconductor layer and a pattern of a doped semiconductor layer As an example, step 2 further comprises:

Step 201: depositing an intrinsic semiconductor material layer 323, a doped semiconductor material layer 324 (the intrinsic semiconductor material layer 323 and the doped semiconductor material layer 324 together form the active layer film), a source/drain metal film 326 and a transparent electrode layer 326 on the substrate gone through step 1, as illustrated in FIG. 1.

Step 202: applying a photoresist 327 on the transparent electrode layer 326.

Figure 2:
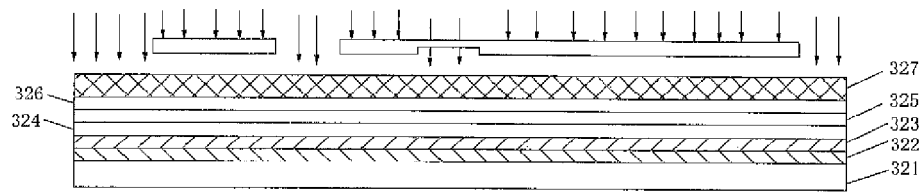
Figure 3:
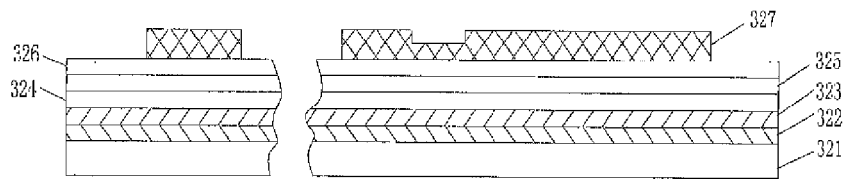

Step 203: exposing and developing the photoresist with a dual-tone mask to form a photoresist-completely-retained region, a photoresist-partially-retained region and a photoresist-completely-removed region, wherein a connection region which connects the drain electrode of the first TFT with the gate electrode of the second TFT (see region A of FIG. 9), a data line and power line region (not shown), a source/drain electrode region of the first TFT and the second TFT (see region B of FIG. 9) as well as a pixel electrode region (see region D of FIG. 9) are within the photoresist-completely-retained region;

A first channel region of the first TFT and a second channel region of the second TFT (see region C of FIG. 9) are within the photoresist-partially-retained region;

Regions other than the above regions are within the photoresist-completely-removed region as shown in FIGS. 2 and 3.

Figure 4:
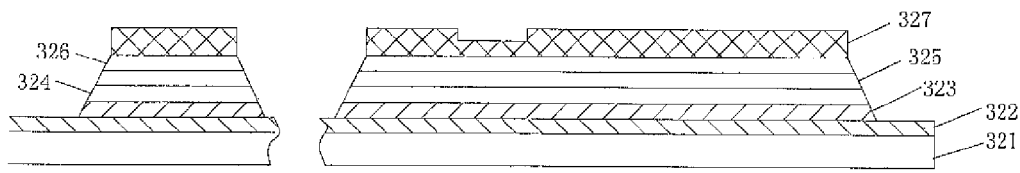

Step 204: removing the transparent electrode layer, the source/drain metal film and the active layer film corresponding to the photoresist-completely-removed region through a first etching process. That is, etching stops at the buffer layer 322. The step is illustrated in FIG. 4.

Figure 5:
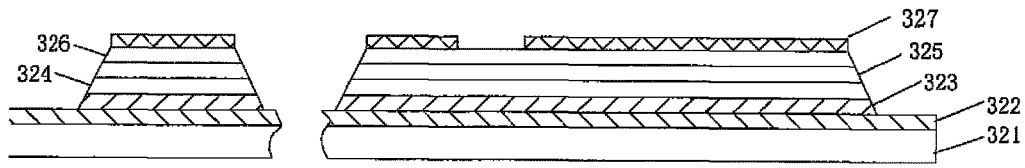

Step 205: removing the photoresist in the photoresist-partially-retained region through an asking process to form the first channel region and the second channel region, as illustrated in FIG. 5.

Step 206: removing the pixel electrode layer 326 and the source/drain electrode metal layer 325 as well as the doped semiconductor layer 324 corresponding to the photoresist-partially-retained region through a second etching process.

It is noted that only the pixel electrode layer 326 and the source/drain metal film 325 need to be removed when the active layer in real production is a single layer, that is, when the active layer comprises only the intrinsic semiconductor 323 as illustrated in FIG. 5.

Step 207: with further reference to FIG. 5, peeling the remaining photoresist to form a pattern of the connection region which connects the drain electrode of the first TFT with the gate electrode of the second TFT, a pattern of the data line and the power line, a pattern of the source/drain electrode region of the first TFT and the second TFT and a pattern of the pixel electrode.

The intrinsic semiconductor layer may be made of for example one or more of IGZO, ITZO, IZO, Cu2O, GZO, AZO, HfIZO, ZnON, and the doped semiconductor layer may be made of one or more of amorphous silicon, polysilicon or microcrystalline silicon.

Optionally, when the active layer is made of an oxide semiconductor material, the oxide semiconductor may be plasma treated in different gas atmosphere. The gas may be for example oxygen, argon, nitric oxide, hydrogen. Alternatively, the oxide semiconductor may be treated with a surfaced modified gas. For example, the semiconductor material may be eroded in the air using hydrogen plasma.

Optionally, the oxide semiconductor layer may be annealed. The annealing is performed under a temperature of 200~500° C. in an environment of air, oxygen, nitrogen, air with water vapor having a molar percent of 1~10% or oxygen with water vapor having a molar percent of 1~10%.

Figure 6:
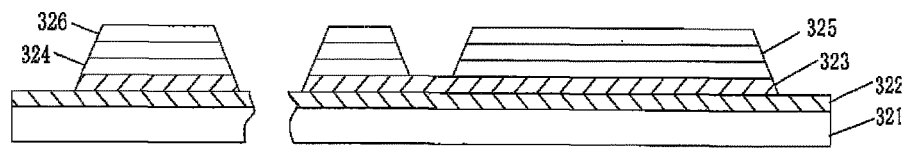
Figure 7:
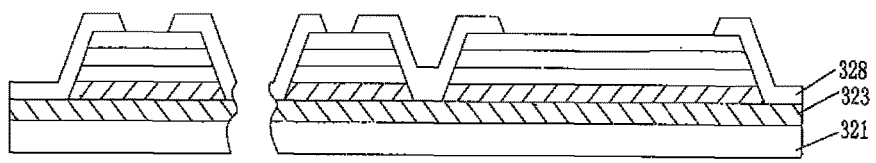

Step 3: forming a gate insulation layer 328 on the substrate gone through step 2, and forming a via hole through a patterning process. The step is illustrated in FIG. 6.

The gate insulation layer may be for example a single layer. Such a gate insulation layer may be one of a silicon oxide film, an aluminum oxide film, a titanium oxide film, a zirconium oxide film, a tantalum oxide film, a barium titanate film, a neodymium oxide film, a silicon oxynitride film, an aluminum oxynitride film, a zirconium oxynitride film, a tantalum oxynitride film, a neodymium oxynitride film, a silicon nitride film, an aluminum nitride film, a zirconium nitride film, and a tantalum nitride film.

Alternatively, the gate insulation layer is a dual-layer comprising a first gate insulation layer and a second gate insulation layer. The first gate insulation layer is disposed closer to the gate electrode layer, and the second gate insulation layer is disposed closer to the active layer. The first gate insulation layer may be one of a silicon oxynitride film, an aluminum oxynitride film, a zirconium oxynitride film, a tantalum oxynitride film, a neodymium oxynitride film, a silicon nitride film, an aluminum nitride film, a zirconium nitride film, and a tantalum nitride film. The second gate insulation layer is made of one of a silicon oxide film, an aluminum oxide film, a titanium oxide film, a silicon oxynitride film, a zirconium oxide film, a tantalum oxide film, a barium titanate film, and a neodymium oxide film, Alternatively, the gate insulation is a three-layer structure comprising a third gate insulation layer, a fourth gate insulation layer and a fifth gate insulation layer. The third gate insulation layer is disposed closer to the gate electrode layer, the fifth gate insulation layer is disposed closer to the active layer, and the fourth gate insulation layer is sandwiched between the third and the fifth gate insulation layers. The third gate insulation layer is made of one of a silicon nitride film, an aluminum nitride film, a zirconium nitride film, and a tantalum nitride film. The fourth gate insulation layer is made of one of a silicon oxynitride film, an aluminum oxynitride film, a zirconium oxynitride film, a tantalum oxynitride film, and a neodymium oxynitride film. The fifth gate insulation layer is made of one of a silicon oxide film, an aluminum oxide film, a titanium oxide film, a silicon oxynitride film, a zirconium oxide film, a tantalum oxide film, a barium titanate film, and a neodymium oxide film.

Furthermore, the above gate insulation layer in different number of layers may be annealed. A specific annealing process comprises: introducing nitrogen or air to a heating chamber of a PECVD apparatus to dehydrogenate the first gate insulation layer, wherein a temperature in the heating chamber is 200° C.~350° C. and the annealing time is 15, to 90 minutes.

Step 4: forming a pattern comprising gate electrodes and gate lines of the first TFT and the second TFT through a single patterning process.

Figure 8:
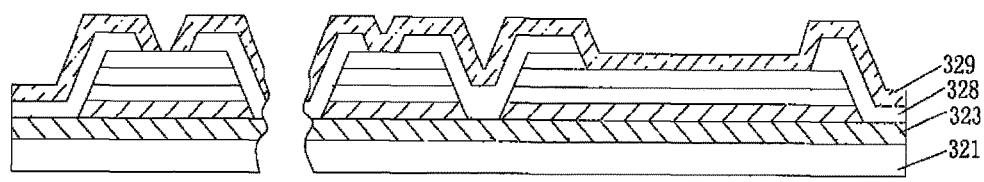
Figure 9:
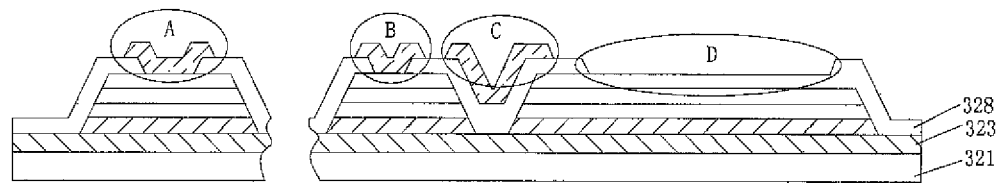

With reference to FIG. 8, a gate metal material 329 is deposited on the substrate gone through step 3 and the gate electrodes and gate lines of the first TFT and the second TFT are formed through a single patterning process. When forming the gate electrodes, the gate electrode above the pixel electrode region has to be etched away to prevent short-circuiting between the gate electrode and the pixel electrode. The main structure of the array substrate is then finished as illustrated in FIG. 9.

Optionally, to further protect the gate electrode on the top, a gate electrode protection layer 330 may be formed on the substrate of step 4. The gate electrode protection layer 330 is generally made of an anti-corrosion and anti-friction electrically conductive film, such as ITO, IZO, TZO films and other electrically conductive films having similar property. Naturally, the gate electrode protection layer 330 may be omitted when the gate electrode is made of a wearable and hard metal film.

The etching process used in the above steps may be wet etching, dry etching or a combination of dry etching and wet etching.

Embodiment 2

Figure 10:
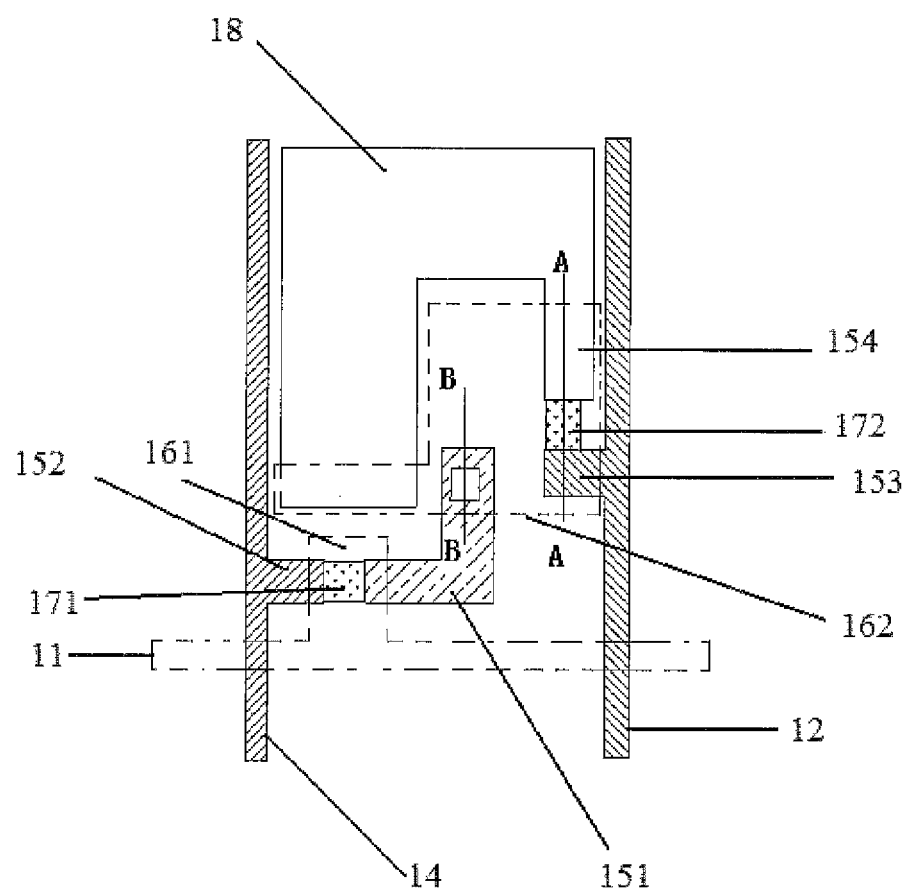
FIG. 10 schematically illustrates a plan view of an array substrate in accordance with an embodiment of the invention.
Figure 11:
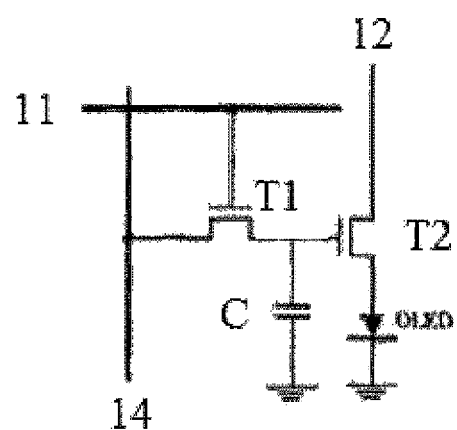
FIG. 11 is an equivalent circuit diagram of the array substrate of FIG. 10.

Based on the method for fabricating an array substrate as described in Embodiment 1,, an embodiment of the invention provides a top-gate array substrate. FIG. 10 schematically illustrates a plan view of an array substrate structure within one of pixel units in accordance with the embodiment of the invention. FIG. 11 is an equivalent circuit diagram of the array substrate of FIG. 10. FIG. 9 illustrates cross sections taken along lines B-B and A-A (the one on the left side taken along line B-B and the one on the right side taken along line A-A) of the array substrate of FIG. 10. In the embodiment, an OLED array substrate is taken as an example. The array substrate comprises an active layer, a data line 14, a power line 12 and a gate line 11, wherein the data line 14 and the power line 12 are vertical to the gate line 11 and define a pixel region together with two neighboring gate lines. A first TFT (also referred to as switch TFT) functioning as an addressing unit, a second TFT (also referred to as drive TFT) for controlling the OLED and a pixel electrode are respectively formed in the pixel region.

The first TFT is located at an intersecting point between the gate line 11 and the data line 14, the second TFT is located at an intersecting point between the gate line 11 and the power line 12, wherein the first drain electrode 151 of the first TFT is connected to the second gate electrode 162 of the second TFT.

The array substrate comprises for example a substrate, patterns of a buffer layer, an active layer, a source/drain electrode, a pixel electrode, a gate insulation layer and a gate electrode are disposed on the substrate, and the source/drain electrode and the pixel electrode are in direct contact with each other.

The active layer comprises a first active layer 171 of the first TFT and a second active layer 172 of the second TFT.

The source/drain electrode comprises a first source electrode 152 and a first drain electrode 151 of the first TFT as well as a second source electrode 153 and a second drain electrode 154 of the second TFT.

A via hole is disposed in the gate insulation layer. The first drain electrode 151 of the first TFT is connected to the second gate electrode 162 of the second TFT by way of the via hole.

The gate electrode is disposed on the gate insulation layer. The gate electrode comprises a first gate electrode 161 of the first TFT and a second gate electrode 162 of the second TFT. The first gate electrode 161, the second gate electrode 162 and the gate line 11 are formed through a single patterning process. The first gate electrode 161 is connected to the gate line 11, the second gate electrode 162 is not connected to the gate line 11. Moreover, the first gate electrode 161 and the second gate electrode 162 are not connected to each other.

In the embodiment, both the gate metal layer and the source/drain metal layer are single layer structure, the material of which may be a metal or an alloy, such as at least one of Cu, Mo, AL, Nd, Ti and alloys thereof.

It is noted that the source electrode and the drain electrode of the TFTs differ from each other by different flow direction of current therein. In the embodiment, the electrode connected to the pixel electrode is referred to as the drain electrode for the convenience of description. The channel region is a gap region between the source electrode and the drain electrode.

The gate insulation layer may be a single layer with the same material as that in Embodiment 1. For achieving a better device property, in the embodiment, the gate insulation layer may be annealed (that is the gate insulation layer is an insulation layer experienced the annealing process), such that influence by hydrogen element and compound of hydrogen in the gate insulation layer on the property of the oxide semiconductor is reduced.

Optionally, the gate insulation layer may also two layers. That is, the gate insulation layer comprises a first gate insulation layer and a second gate insulation layer, the first gate insulation layer is disposed closer to the gate electrode and the second gate insulation layer is disposed closer to the active layer. Materials of the first and second gate insulation layers are the same as those in Embodiment 1. As an example, the first gate insulation layer and/or the second gate insulation layer are annealed insulation layers. The material of the first gate insulation layer may well suppress the adversary effect of the gate electrode (especially when it is made of copper or alloys thereof). A function of the second gate insulation layer is to match well with the oxide semiconductor such that the performance of the device is improved. The material of the second gate insulation layer is typically an oxide insulation layer, which has poor performance in preventing diffusion of radical groups such as H+ and OH−. Therefore, the first gate insulation layer is preferably annealed after it is finished, so as to reduce the possibility of break caused by the diffusion of H+, OH− in the first gate insulation layer, which further helps to improve the stability of the device.

Optionally, the gate insulation layer may also be three layers, that is, the gate insulation layer comprises a third gate insulation layer, a fourth gate insulation layer and a fifth gate insulation layer, the third gate insulation layer is disposed closer to the gate electrode, the fifth gate insulation layer is disposed closer to the active layer and the fourth gate insulation layer is sandwiched between the third gate insulation layer and the fifth gate insulation layer. Materials of the third, fourth and fifth gate insulation layers are the same as those in Embodiment 1.

In the embodiment, the third gate insulation layer is made of an inorganic insulation material such as silicon nitride film. Such a material will degrade the performance of the oxide semiconductor layer when in direct contact with the oxide semiconductor layer, while it can well suppress adversary effect caused by contact with the gate metal electrode (especially when the gate is made of copper or alloy thereof). In considering of the above, the third gate insulation layer is disposed as right against the gate electrode but away from the active layer. As the fourth gate insulation layer made of inorganic insulation materials such as a silicon oxynitride film has few radical groups such as H+, OH− in itself, meanwhile, it has good penetration resistance performance for the radical groups such as H+, OH−, as a result, it can well suppress the diffusion of the H+, OH radical groups to the oxide semiconductor layer, thereby improving the stability of the device. Therefore, the fourth gate insulation layer is disposed as an intermediate layer. To improve the performance of the device to a maximum extent, the fifth gate insulation layer is right against the oxide semiconductor, thereby matching with the oxide semiconductor in a better way and improving the stability of the device.

It is noted that the method of fabricating two TFTs in the embodiment is also applicable to methods for fabricating an array substrate with only one TFT or more TFTs.

Embodiment 3

An embodiment of the invention further provides a display device comprising the above array substrate. The display device may be a liquid crystal panel, an E-paper, an OLED panel, a mobile phone, a tablet PC, a television, a display device, a notebook PC, a digital photoframe, a navigator and any product or component having a display function.

In the above embodiments, the fabrication cycle of the TFT is significantly shortened and the stability of the TFT increased by improving the fabrication processes of the array substrate, such that the threshold voltage of the TFT will not drift severely. Meanwhile, product yield is improved and the lifetime of the device is extended.

What are described above is related to the illustrative embodiments of the disclosure only and not limitative to the scope of the disclosure; the scopes of the disclosure are defined by the accompanying claims.

What is claimed is:

1. A method for fabricating an array substrate, wherein the array substrate comprises a first TFT and a pixel electrode, the method comprising:

forming a buffer layer on a substrate; and depositing an active layer film, a source/drain metal film and a transparent electrode layer on the substrate having the buffer layer formed thereon, and forming patterns of an active layer, a source/drain electrode and a pixel electrode of the first TFT through a single patterning process.

2. The method of claim 1, wherein the array substrate further comprises a second TFT, wherein active layers, source/drain electrodes and pixel electrodes of both the first and second TFTs are formed through the same patterning process.

3. The method of claim 2, further comprising the following steps after forming the patterns of the active layer, the source/drain electrode and the pixel electrode:

forming a pattern of a gate insulation layer and a via hole on the substrate;

forming patterns of gate electrodes and gate lines of the first and second TFTs on the pattern of gate insulation layer.

4. The method of claim 3, further comprising:

forming a gate protection layer on the patterns of the gate electrodes and the gate lines.

5. The method of claim 2, wherein the step of forming active layers, source/drain electrode layers and pixel electrode layers of both the first and second TFTs through the same patterning process comprises:

depositing an active layer film, a source/drain metal film and a transparent electrode layer;

applying a photoresist;

exposing and developing the photoresist by using a dual-tone mask to form a photoresist-completely-retained region, a photoresist-partially-retained region and a photoresist-completely-removed region, wherein a connection region which connects the drain electrode of the first TFT to the gate electrode of the second TFT, a data line and a power line region, a source/drain electrode region of the first TFT and the second TFT as well as a pixel electrode region are within the photoresist-completely-retained region, a first channel region of the first TFT and a second channel region of the second TFT are within the photoresist-partially-retained region, regions other than the above regions are within the photoresist-completely-removed region;

removing the transparent electrode layer, the source/drain metal film and the active layer film corresponding to the photoresist-completely-removed region through a first etching process;

removing the photoresist in the photoresist-partially-retained region through an asking process to form the first channel region and the second channel region;

removing the pixel electrode layer and the source/drain metal film corresponding to the photoresist-partially-retained region through a second etching process;

peeling the remaining photoresist to form a pattern of the connection region which connects the drain electrode of the first TFT to the gate electrode of the second TFT, a pattern of the data line and the power line, a pattern of the source/drain electrode region of the first TFT and the second TFT and a pattern of the pixel electrode.

6. The method of claim 3, wherein the step of forming patterns of gate electrodes and gate lines of the first and second TFTs on the pattern of gate insulation layer comprises:

depositing a gate metal layer, forming the gate electrodes and the gate lines of the first and second TFTs through a patterning process, and etching away the gate electrode above the pixel electrode region.

7. The method of claim 3, wherein the gate insulation layer is annealed.

8. The method of claim 7, wherein the gate insulation layer is a single layer made of one of a silicon oxide film, an aluminum oxide film, a titanium oxide film, a zirconium oxide film, a tantalum oxide film, a barium titanate film, a neodymium oxide film, a silicon oxynitride film, an aluminum oxynitride film, a zirconium oxynitride film, a tantalum oxynitride film, a neodymium oxynitride film, a silicon nitride film, an aluminum nitride film, a zirconium nitride film, and a tantalum nitride film; or the gate insulation layer comprises a first gate insulation layer and a second gate insulation layer, the first gate insulation layer is disposed closer to the gate electrode layer, the second gate insulation layer is disposed closer to the active layer, the first gate insulation layer is made of one of a silicon oxynitride film, an aluminum oxynitride film, a zirconium oxynitride film, a tantalum oxynitride film, a neodymium oxynitride film, a silicon nitride film, an aluminum nitride film, a zirconium nitride film, and a tantalum nitride film, the second gate insulation layer is made of one of a silicon oxide film, an aluminum oxide film, a titanium oxide film, a silicon oxynitride film, a zirconium oxide film, a tantalum oxide film, a barium titanate film, and a neodymium oxide film; or the gate insulation comprises a third gate insulation layer, a fourth gate insulation layer and a fifth gate insulation layer, the third gate insulation layer is disposed closer to the gate electrode layer, the fifth gate insulation layer is disposed closer to the active layer, the fourth gate insulation layer is sandwiched between the third and the fifth gate insulation layers, the third gate insulation layer is made of one of a silicon nitride film, an aluminum nitride film, a zirconium nitride film, and a tantalum nitride film, the fourth gate insulation layer is made of one of a silicon oxynitride film, an aluminum oxynitride film, a zirconium oxynitride film, a tantalum oxynitride film, a neodymium oxynitride film, the fifth gate insulation layer is made of one of a silicon oxide film, an aluminum oxide film, a titanium oxide film, a silicon oxynitride film, a zirconium oxide film, a tantalum oxide film, a barium titanate film, and a neodymium oxide film.

9. The method of claim 1, wherein the active layer comprises at least one of an intrinsic semiconductor layer and a doped semiconductor layer, wherein the intrinsic semiconductor layer is made of a material comprising at least one of IGZO, ITZO, IZO, Cu2O, GZO, AZO, HfIZO, or ZnON, the doped semiconductor layer is made of a material comprising at least one of amorphous silicon, poly-silicon, or microcrystalline silicon.

10. The method of claim 1, wherein the active layer is made of an oxide semiconductor material which is plasma treated.

11. The method of claim 1, wherein the active layer is made of an oxide semiconductor material, which is annealed at a temperature from 200° C. to 500° C. in an atmosphere of air, oxygen or nitrogen.

12. An array substrate fabricated according to the method of claim 1, comprising:
a substrate;
a buffer layer, an active layer, a source/drain electrode, a pixel electrode, a gate insulation layer, and a gate electrode layer disposed on the substrate, wherein the source/drain electrode is in direct contact with the pixel electrode.

13. The array substrate of claim 12, wherein the gate electrode layer comprises a first gate electrode of a first TFT and a second gate electrode of a second TFT,
the active layer comprises a first active layer of the first TFT and a second active layer of the second TFT,
the source/drain electrode comprise a first source electrode and a first drain electrode of the first TFT as well as a second source and a second drain electrode of the second TFT.

14. The array substrate of claim 12, wherein the gate insulation layer is annealed.

15. The array substrate of claim 14, wherein the gate insulation layer is a single layer, and the gate insulation layer is made of one of a silicon oxide film, an aluminum oxide film, a titanium oxide film, a zirconium oxide film, a tantalum oxide film, a barium titanate film, a neodymium oxide film, a silicon oxynitride film, an aluminum oxynitride film, a zirconium oxynitride film, a tantalum oxynitride film, a neodymium oxynitride film, a silicon nitride film, an aluminum nitride film, a zirconium nitride film, and a tantalum nitride film; or the gate insulation layer comprises a first gate insulation layer and a second gate insulation layer, the first gate insulation layer is disposed closer to the gate electrode layer, the second gate insulation layer is disposed closer to the active layer, a pattern of the first gate insulation layer is made of one of a silicon oxynitride film, an aluminum oxynitride film, a zirconium oxynitride film, a tantalum oxynitride film, a neodymium oxynitride film, a silicon nitride film, an aluminum nitride film, a zirconium nitride film, and a tantalum nitride film, the second gate insulation layer is made of one of a silicon oxide film, an aluminum oxide film, a titanium oxide film, a silicon oxynitride film, a zirconium oxide film, a tantalum oxide film, a barium titanate film, and a neodymium oxide film; or the gate insulation comprises a third gate insulation layer, a fourth gate insulation layer and a fifth gate insulation layer, the third gate insulation layer is disposed closer to the gate electrode layer, the fifth gate insulation layer is disposed closer to the active layer, the fourth gate insulation layer is sandwiched between the third and the fifth gate insulation layers, the third gate insulation layer is made of one of a silicon nitride film, an aluminum nitride film, a zirconium nitride film, and a tantalum nitride film, the fourth gate insulation layer is made of one of a silicon oxynitride film, an aluminum oxynitride film, a zirconium oxynitride film, a tantalum oxynitride film, a neodymium oxynitride film, the fifth gate insulation layer is made of one of a silicon oxide film, an aluminum oxide film, a titanium oxide film, a silicon oxynitride film, a zirconium oxide film, a tantalum oxide film, a barium titanate film, and a neodymium oxide film.

16. The array substrate of claim 12, wherein the active layer comprises at least one of an intrinsic semiconductor layer and a doped semiconductor layer, wherein the intrinsic semiconductor layer is made of a material comprising at least one of IGZO, ITZO, IZO, Cu2O, GZO, AZO, HfIZO, or ZnON, and the doped semiconductor layer is made of a material comprising at least one of amorphous silicon, poly-silicon, or microcrystalline silicon.

17. A display device, comprising the array substrate of claim 12.

\* \* \* \* \*